(12) United States Patent
Bill

(10) Patent No.: US 10,103,732 B1
(45) Date of Patent: Oct. 16, 2018

(54) LOW POWER VOLTAGE LEVEL SHIFTER CIRCUIT

(71) Applicant: Synopsys, Inc., Mountain View, CA (US)

(72) Inventor: Colin Stewart Bill, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/724,861

(22) Filed: Oct. 4, 2017

(51) Int. Cl.
- *H03K 19/094* (2006.01)
- *H03K 19/00* (2006.01)
- *H03K 19/0185* (2006.01)

(52) U.S. Cl.
CPC . *H03K 19/0013* (2013.01); *H03K 19/018521* (2013.01)

(58) Field of Classification Search
CPC .............. H03K 19/0013; H03K 19/018521
USPC .................................................... 326/81
See application file for complete search history.

(56) References Cited

U.S. PATENT DOCUMENTS

| | | | | |
|---|---|---|---|---|
| 7,436,213 B2* | 10/2008 | Nojiri | ............... | H03K 3/012 326/68 |
| 8,742,821 B2* | 6/2014 | Liu | ............... | H03K 3/012 326/80 |
| 9,852,805 B2 | 12/2017 | Luan et al. | | |
| 2002/0057296 A1* | 5/2002 | Reinhardt | ............... | G09G 5/00 715/810 |
| 2003/0071296 A1 | 4/2003 | Peng | | |
| 2003/0198085 A1 | 10/2003 | Peng | | |
| 2006/0208759 A1* | 9/2006 | Nojiri | ............... | H03K 3/012 326/81 |
| 2006/0221698 A1 | 10/2006 | Obuchi | | |
| 2007/0030719 A1 | 2/2007 | Hoefler et al. | | |
| 2012/0008364 A1 | 1/2012 | Lai et al. | | |
| 2012/0056656 A1* | 3/2012 | Chen | ............... | H03K 3/35613 327/333 |
| 2013/0169188 A1* | 7/2013 | Duan | ............... | G01R 19/12 315/307 |

(Continued)

FOREIGN PATENT DOCUMENTS

KR          101095730 B1       12/2011

OTHER PUBLICATIONS

European Extended Search Report, European Application No. 17175419.5, dated Oct. 17, 2017, 7 pages.

*Primary Examiner* — Don Le
(74) *Attorney, Agent, or Firm* — Fenwick & West LLP

(57) ABSTRACT

A low power voltage level shifter circuit in which current is limited through at least one of a plurality of CMOS logic circuits, one of which receives input signals within a first voltage level and is connected between a first upper and lower power supply, a second of which transmits shifted output signals within a second voltage level and is connected between a second upper and lower power supply. There is at least one current-limiting MOS transistor connected between at one of the CMOS logic circuits and one of its power supplies. Typically, there is at least one current-limiting MOS transistor between the second CMOS logic circuit which transmits the shifted output signals which have a larger range than that of the input signals. A second current through the at least one current-limiting MOS transistor mirrors a set current through a first MOS transistor so that power consumed by the CMOS logic circuit during switching is limited.

32 Claims, 2 Drawing Sheets

(56) References Cited

U.S. PATENT DOCUMENTS

2015/0194961 A1\* 7/2015 Luthra ............ H03K 19/01857
365/148

\* cited by examiner

LOW POWER VOLTAGE LEVEL SHIFTER CIRCUIT

BACKGROUND OF THE INVENTION

This invention relates to a circuit which shifts a logic signal from one voltage level to another in an integrated circuit. In particular, the circuit shifts a logic signal from a low voltage supply magnitude to a higher voltage supply magnitude and is useful for systems with very low available power.

This level shift function is needed whenever a logic gate output operating at one power supply voltage level drives the input of another logic gate which operates at a different power supply voltage level. An example of such a situation is in an integrated circuit having a One-Time-Programmable (OTP) memory where the address decoding logic, which may operate from a $V_{DD}=0.8V$ supply, needs to drive an OTP memory array decoder operating at 1.3V. That is, the address decoding logic circuits operate between 0V and 0.8V, and the memory array decoder circuits operate between 0V and 1.3V. This disparity in voltage levels requires a voltage level shifter circuit.

A problem with a conventional voltage level shifter is that during the time when the level shifter is switching, there is a significant current draw from the power supplies. Some applications do not have the available power to provide this switching current.

A voltage level shifter circuit is needed where the maximum switching current can be controlled so that power consumption significantly reduced. The present invention provides for such a design.

BRIEF SUMMARY OF THE INVENTION

The present invention provides for a level shifter circuit in an integrated circuit. The voltage level shifter circuit has a first MOS transistor having a set current therethrough; a first CMOS logic circuit receiving input signals within a first voltage level and connected between a first upper and lower power supply; a second CMOS logic circuit transmitting shifted output signals, the shifted output signals within a second voltage level, and connected between a second upper and lower power supply; and at least one current-limiting MOS transistor connected between at least one of the CMOS logic circuits and the second upper or lower power supply, a second current through the at least one current-limiting MOS transistor mirroring the set current through the first MOS transistor, whereby the power consumed by the at least one CMOS logic circuit during a switching operation is limited.

The present invention also provides for a method of operating a low-power level shifter circuit, the circuit having a first CMOS logic circuit receiving input signals within a first voltage level, and a second CMOS logic circuit transmitting shifted output signals within a second voltage level. The method has the steps of: generating a first set current; passing the first set current through a first MOS transistor; mirroring the first set current through the first MOS transistor with at least one second current through the at least one second MOS transistor; and driving the second CMOS logic circuit with the at least one second current; wherein power consumed by the second CMOS logic circuit is limited by the at least one second current mirroring the first set current.

The present invention also provides for a voltage level shifter circuit in an integrated circuit. The voltage level shifter circuit has a first voltage level driver circuit receiving signals within a first voltage level, the first voltage level driver circuit operating at a first voltage level and connected to a first voltage power supply; a protection logic circuit receiving signals from the first voltage level driver circuit and shifting the first logic level signals to second logic level signals; a second voltage level logic circuit receiving signals from the protection logic circuit, the second voltage level logic circuit operating at a second voltage level and connected to a second voltage power supply; a bias voltage generator circuit; and at least one current-limiting MOS transistor connected between the second voltage level logic circuit and the second voltage power supply, the at least one current-limiting transistor responsive to a bias voltage from the bias voltage generator circuit to provide a set current through the second voltage level logic circuit to limit the amount of power consumed by the second voltage level logic circuit.

Other objects, features, and advantages of the present invention will become apparent upon consideration of the following detailed description and the accompanying drawings, in which like reference designations represent like features throughout the figures.

DETAILED DESCRIPTION OF THE INVENTION

There are many applications for which the available power for an integrated circuit is very low. For example, an electronic device might harvest the power or energy from an external Radio-Frequency (RF) oscillating electric field, such as a passive RFID-tag (Radio Frequency IDentification tag). (An active RFID-tag has its own power supply, such as a battery.) The integrated circuit for the passive RFID-tag may contain a One-Time Programmable (OTP) memory and a logic controller block, each operating at different logic levels. The available power for the entire integrated circuit is very low, for example, 10 uW might be a typical value. The logic circuits in the integrated circuit must operate so as not to significantly disturb the power supply and a conventional voltage level shifter operating with the logic circuits could take so much current from the power supply that a single placement of the voltage level shifter circuit could collapse the supply when the attached logic circuit switches. But a passive RFID-tag logic design may require hundreds of the voltage level shifter functions and their corresponding circuits. Hence any voltage level shifter circuit must consume minimal power to be suitable for a passive RFID-tag application.

Other systems with very low available power and requirements of minimum energy consumption include mobile, hand-held electronic devices. Furthermore, the integrated circuits for such devices are typically small so that any low power solution for voltage level shifter functions should occupy a minimal area on the integrated circuit substrate.

Figure 1:
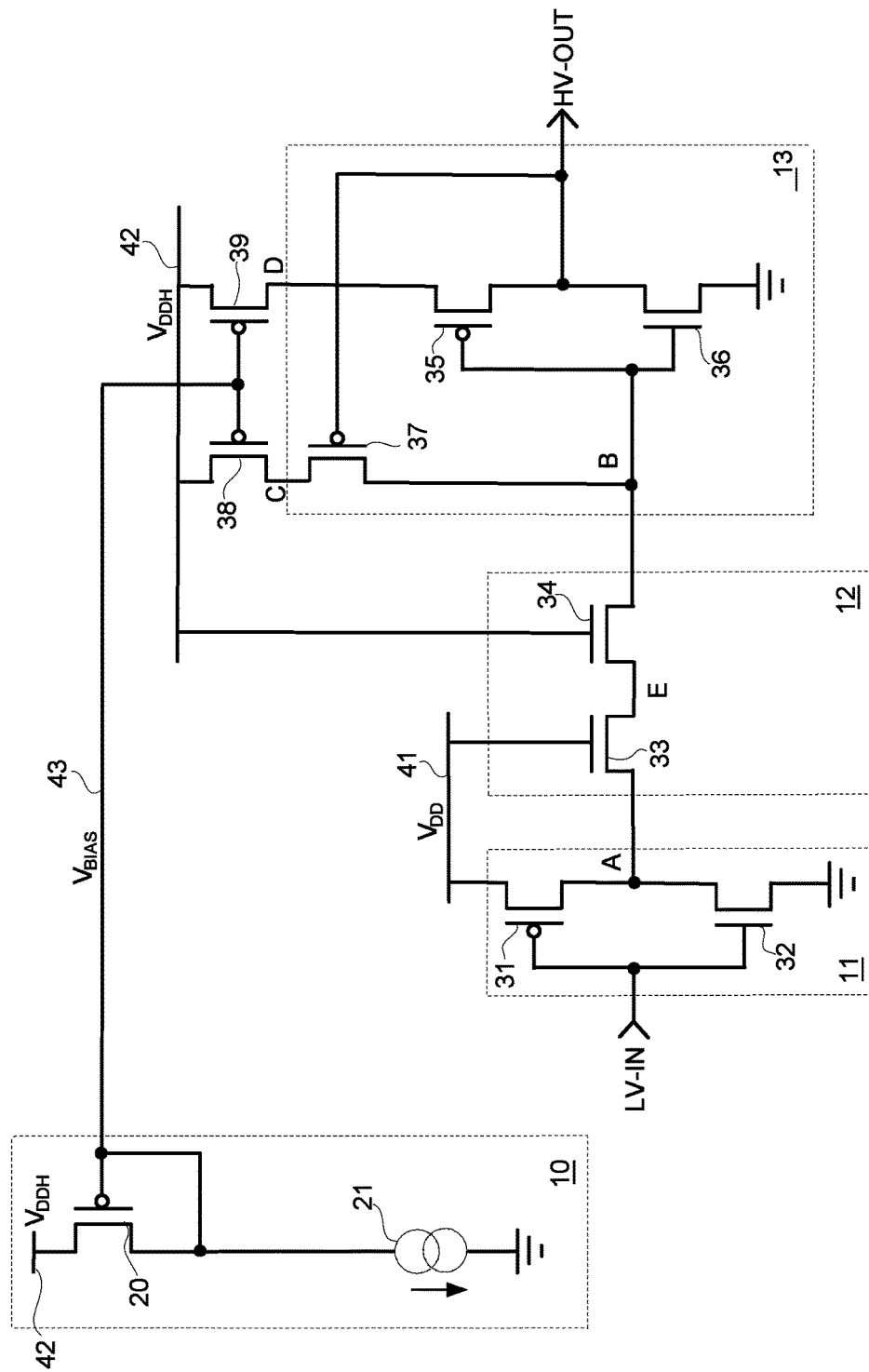
FIG. 1 shows a voltage level shifter circuit, according to one embodiment of the present invention.

FIG. 1 shows a low-power voltage level shifter circuit according to one embodiment of the present invention. The voltage level shifter circuit has a low voltage level input logic block 11, a low voltage level-to-high voltage level protection logic block 12, and a high voltage level driver and latch block 13. The voltage level shifter "shifts" logic signals of a first level to logic signals of a second higher level. That is, logic signals of the second level swing over a wider range of voltages than does the logic signals of the first level. In the described circuit, ground, or 0V is common as the lower supply voltage of both voltage levels, hence the second level signals reach higher voltages.

A logic inverter formed by the PMOS transistor 31 and NMOS transistor 32 represents the low voltage level input logic block 11. A source/drain of the PMOS transistor 31 is connected to an upper voltage supply 41 at $V_{DD}$ while a source/drain of the NMOS transistor 32 is connected to the lower voltage supply (ground). Two serially-connected NMOS transistors 33 and 34 of the low voltage level-to-high voltage level protection logic block 12 connects a node A, the output of the low voltage level input logic block 11, to a node B, the input of the high voltage level driver and latch block 13. The gate of the NMOS transistor 33 is connected to the upper voltage supply line 41 at $V_{DD}$ and the gate of the NMOS transistor 34 is connected to another upper voltage supply line 42 at $V_{DDH}$. $V_{DD}$ and $V_{DDH}$ are the upper supply voltages for the low voltage level and high voltage level respectively.

The high voltage level driver and latch block 13 has PMOS and NMOS transistors 35, 36 connected as a logic inverter and a PMOS transistor 37 as a feedback connection between the HV-OUT output of the block 13 and the input node B. That is, the gate is connected to the HV-OUT output and a source/drain of the transistor 37 is connected to the node B. The second source/drain of the transistor 37, node C, is connected to the second upper voltage supply 42 through a PMOS transistor 38. Similarly, the source/drain of the PMOS transistor 35 not connected to the output HV-OUT, node D, is connected to the second upper voltage supply 42 through a second PMOS transistor 39. The two PMOS transistors 38, 39 are described in detail below.

The PMOS transistor 31 and NMOS transistor 32 of the low voltage level input logic block 11, and NMOS transistor 33 of the low voltage level-to-high voltage level protection logic block 12 are only exposed to low voltages of the first voltage level and are implemented as "low-voltage" thin-gate oxide transistors in the process technology. The NMOS transistor 34 of the low voltage level-to-high voltage level protection logic block 12, NMOS transistor 36 and PMOS transistors 35, 37 of the high voltage level driver and latch block 13, see "high voltages" and are implemented with thick gate oxide versions of the available semiconductor process transistors. One example of the upper supply voltage $V_{DD}$ is 0.8V and of upper supply voltage $V_{DDH}$ is 1.3V or 1.8V. These values are applicable in current semiconductor processing technologies, such as a technology with critical dimensions of 14 nm.

In the operation of the voltage level shifter circuit of FIG. 1, the low voltage input logic block 11 accepts the lower voltage input LV-IN and generates an inverted low level output at node A. That is, the logic signal at the LV-IN terminal is logically inverted at the node A with the logic signals remaining at the low voltage level. The low voltage-to-high voltage protection logic block 12 receives at node A the logic signals at the low voltage level and translates the logic signals to the high voltage level at node B. For example, a logic 0 at the low voltage level remains at ground at the high voltage level but a logic 1 at the low voltage level is translated from $V_{DD}$ to $V_{DDH}$ at the high voltage level. (In passing it should be understood that the correspondence of logic 0 with a low voltage level and logic 1 with a high voltage level is arbitrary and could be reversed.) The logic signal at node B provides the input for the high voltage driver and latch block 13. The high voltage level signal at node B is inverted by the block 13 at the output terminal HV-OUT and through the operation of the PMOS transistor 37 the signal values at node A and output terminal HV-OUT are latched.

The described voltage level shifter circuit is implemented in CMOS logic and that the low voltage input logic block 11 and the high voltage driver and latch block 13 are inverter circuits. The low voltage-to-high voltage protection logic block 12 bridges the two blocks 11 and 13; the source/drains of the two transistors 33, 34 are not directly connected to any supply voltages. Hence when the voltage level shifter circuit is static, i.e., is in one state or the other (LV-IN=logic 1 and HV-OUT=logic 0; or LVIN=logic 0 and HV-OUT=logic 1), no current flows through the shifter circuit (other than undesirable leakage currents) and no power is consumed.

However, during switching from one logic state to the other, there is a direct current path between an upper voltage supply and a lower voltage supply. Current flows through the shifter circuit and power is consumed. For example, when LV-IN input signal changes from a logic 0 to a logic 1, i.e., the input signal changes from 0V to 0.8V, for example, the node A transitions from logic 1 to logic 0 (0V), and the node B follows the node A to logic 0 through the NMOS transistors 33 and 34 which are in conducting states. Previous to transitioning to logic 0 (0V), the node B had been at $V_{DDH}$ before falling to 0V. In response to the node B going to logic 0, the output terminal HV-OUT moves high to logic 1, e.g., 1.8V. During this switching process, there is a direct current path from the high voltage supply at $V_{DDH}$ through the PMOS transistor 37, and NMOS transistors 34, 33 and 32, which are all turned on. The current also passes through the PMOS transistor 38 which connects the transistor 37 to the $V_{DDH}$ voltage supply. Furthermore, the switching of the output terminal HV-OUT to logic 1 also requires that the capacitance of the load connected to the output terminal be pulled high. A transient current occurs from $V_{DDH}$ voltage supply through the PMOS transistor 35 (and through the PMOS transistor 39 which connects the transistor 35 to the $V_{DDH}$ voltage supply) to the HV-OUT output terminal. These transient currents can be sufficiently high, e.g., 10 μA to 50 μA, so to collapse a $V_{DDH}$ voltage supply used in limited power applications.

Likewise, when LV-IN input signal changes from a logic 1 to a logic 0, i.e., the input signal changes from 0.8V to 0V, the node A transitions from 0V to $V_{DD}$ (=0.8V in this example), and the node B follows the node A to $V_{DDH}$ (1.8V, in this example) through the NMOS transistors 33 and 34. With node B high, the output terminal HV-OUT transitions to logic 0 or 0V. But as node B rises in voltage, the NMOS transistors 33 and 34 shut off at approximately one NMOS threshold voltage $V_T$ below $V_{DD}$. This is high enough for the NMOS transistor 36 to turn on for a transient current flow through the transistors 39, 35 and 36. Again this current can be quite high, sufficiently high so as to collapse the $V_{DDH}$ voltage supply.

To manage the effects of these transient currents, the present invention provides for current-limiting transistors, such as the PMOS transistors 38 and 39 interposed between the upper $V_{DDH}$ voltage supply and voltage level shifter circuit, to limit currents through voltage level shifter circuit to low values. The transistors 38 and 39 limit the current from the $V_{DDH}$ voltage supply during the time when the level shifter is switching output states, either "0" to "1", or "1" to "0." If the voltage level shifter circuit nodes C and D were connected directly to the $V_{DDH}$ voltage supply, the large transient currents described above during switching would undesirably collapse the limited voltage supply.

It should be noted that a current-limiting transistor could have been placed between the low voltage level input logic block 11 and the $V_{DD}$ upper voltage supply and, indeed, one or more current-limiting transistors could be placed between a CMOS logic circuit and its voltage supply to reduce power consumption during switching in different (and more complex) arrangements of the voltage level shifter circuit. In the FIG. 1 embodiment, the current-limiting transistors 38 and 39 are placed to protect the voltage level shifter circuit against the largest transient currents during switching, i.e., those currents emanating from the $V_{DDH}$ voltage supply through the high voltage level driver and latch block 13. The $V_{DD}$ supply voltage being lower than the $V_{DDH}$ supply voltage supply, the transient current through the low voltage level input logic block 11 may not be sufficient to collapse the power supply of the particular application and hence is not limited. Applications dictate the particular configurations of the voltage level shifter circuit.

Furthermore, the limitation in the currents driving the logic circuit(s) of the voltage level shifter circuit slows the switching speeds of the circuit. With the benefit of low power consumption, there is the disadvantage of reduced performance of the voltage level shifter circuit. By limiting the current to a logic circuit, the speed at which the logic circuit can switch states is reduced.

Currents through the PMOS transistors 38 and 39 of the FIG. 1 embodiment are limited by the $V_{BIAS}$ voltage on the gates of the transistors 38, 39 connected to the $V_{BIAS}$ line 43. The $V_{BIAS}$ line 43 is connected to a PMOS transistor 20 in a bias voltage generator block 10 which also includes a current source/sink 21 which pulls a set amount of current through the PMOS transistor 20. The PMOS transistors 38 and 39 are arranged as current mirrors of the PMOS transistor 20. The transistors 20, 38 and 39 have a source/drain connected to the $V_{DDH}$ voltage supply and their gates are connected together. The second source/drain of the transistor 20 is connected to its gate and to the source/sink 21. The second source/drain of the PMOS transistor 38 is connected to the node C and a source/drain of the PMOS transistor 37 of the high voltage level driver and latch block 13, and the second source/drain of the PMOS transistor 39 is connected to the node D and to a source/drain of the PMOS transistor 35 of the block 13.

By physically matching the PMOS transistors 38 and 39 to the PMOS transistor 20, the common $V_{BIAS}$ voltage on the gates of the three transistors 20, 38 and 39 ensure that the currents through the transistors 38 and 39 match the current which passes through the transistor 20. One way to ensure that the physical layouts of the transistor 38, 39, and 20 are closely matched in geometry is to surround the transistors with dummy transistor devices of a similar geometry in order to create a uniform lithographic environment around the transistors. This allows proper matching of the electrical parameters and resulting performances of the current-limiting transistors 38, 39 with the transistor 20.

The current through the PMOS transistor 20 is set by the source/sink 21 to a very small value of 0.1 µA, for example, so the currents through the PMOS transistors 38 and 39 are each also set to 0.1 µA. The currents set by the PMOS transistors 38 and 39 limit the transient load currents through the level shifter circuit to avoid collapsing the $V_{DDH}$ power supply.

The current magnitude set by the source/sink 21 through the PMOS transistor 20 is such that the transistor 20 is biased close to its threshold voltage $V_T$, i.e., the difference between the gate-source voltage $V_{GS}$ and the threshold voltage $V_T$ of the transistor 20 is very small to reflect the very small current through the transistor 20, such as from 0.1 uA to 0.5 uA. From the connection configuration of the transistor 20, the voltage on the transistor gate, $V_{BIAS}$, is approximately one threshold voltage $V_T$ of the PMOS transistor below $V_{DDH}$. From the current mirror arrangement the gate voltages of the current-limiting PMOS transistors 38 and 39 at $V_{BIAS}$ ensures that the $V_{GS}$ of transistors 38, 39 are also near their threshold voltages $V_T$ so that these transistors operate close to their cut-off or in their sub-threshold modes where the transistor currents are very small also. For example, the $(V_{GS}-V_T)$ of the PMOS transistor 20 may be in the range of ±100 mV where the negative values can be considered operation in the sub-threshold mode.

The voltage level shifter circuit is particularly suitable for integrated circuits having limited areas, i.e., applications which require that the resulting circuit occupy a small footprint on the semiconductor die. Besides the two current-limiting transistors 38 and 39 and the transistor 20 of the bias voltage generator block 10, only the current source/sink 21 has been added. Typically, the well-known beta-multiplier reference circuit is used as a current source/sink. The potential advantage of this circuit is that it should be fairly immune to variations in the supply voltage $V_{DDH}$. However, where area is severely limited and a MOS transistor-connected string is used instead of a semiconductor process resistor structure (e.g., an n-well, diffusion or polysilicon resistor) which can occupy a large area, the generated reference current of the beta-multiplier circuit is found to have severe variations due to a strong dependence upon variations in the MOS transistor's resistance and in the worst case, can unintentionally approach zero causing poor operation in the level shifter circuit.

Figure 2:
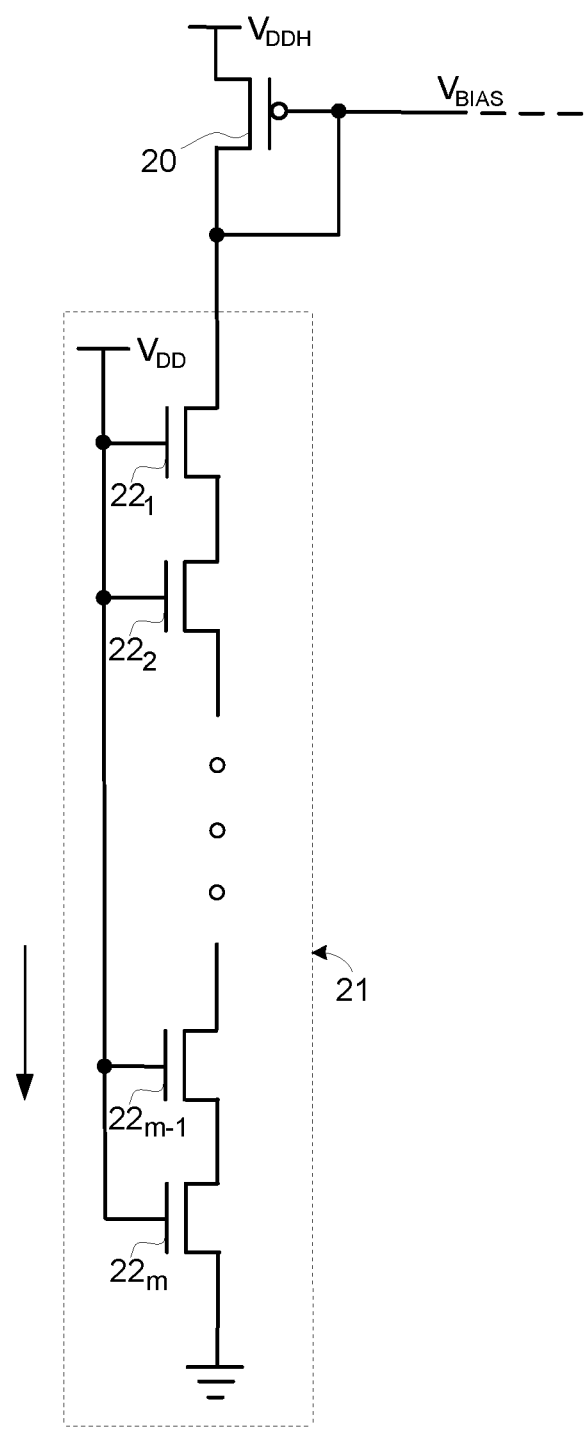
FIG. 2 shows details of the current source/sink in the reference voltage generator of the FIG. 1 voltage level shifter circuit.

Instead, the present invention offers a particularly useful current source/sink circuit for the voltage level shifter even when area availability is tight. As illustrated by the exemplary embodiment in FIG. 2, the current source/sink 21 is formed by a short string of series-connected NMOS transistors $22_1$-$22_m$ with their gates tied to a voltage reference. In the simplest case, the transistor gates can be tied to a supply voltage, the $V_{DD}$ potential. The load is the PMOS transistor 20 with its gate tied to the drain of the transistor. This approach can limit currents to very low values with minimized circuit areas. The described circuit provides a smaller current variation than a compact beta-multiplier reference using the same small-area resistor component. An example of the efficacy of the voltage level shifter circuit with the described current source/sink is an ASIC (Application-Specific Integrated Circuit) with 640 memory bit cells, read path circuitry and parts of the high-voltage programming circuitry implemented in a 14 nm semiconductor process occupying only an area of 50 µm×56 µm=2800 µm².

Rather than changing the number of MOS transistors $22_1$-$22_m$ in the current source/sink 21, an alternative way to control the current in the voltage level shifter circuit is to adjust the relative geometrical sizes of PMOS transistor 20 with respect to the PMOS transistors 38 and 39. However, this approach is much less precise than the design described above.

Hence the present invention provides for voltage level shifter circuit which consumes very little power and is highly suitable to integrated circuit applications with very limited power capability. Furthermore, the current source/sink of series-connected MOS transistors occupies a very limited area which makes the voltage level shifter circuit to be adaptable for many small integrated circuits.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A voltage level shifter circuit comprising:
    a first MOS (metal-oxide-semiconductor) transistor having a set current passing through the first MOS transistor;
    a first CMOS (complementary metal-oxide-semiconductor) logic circuit receiving input signals within a first voltage level and connected between a first upper power supply and a first lower power supply;
    a second CMOS logic circuit transmitting shifted output signals, the shifted output signals within a second voltage level, and directly connected between at least two current-limiting MOS transistors and a second upper power supply or a second lower power supply; and
    the at least two current-limiting MOS transistors connected between the second CMOS logic circuit and the second upper power supply or the second lower power supply, currents through the current-limiting MOS transistors mirroring the set current through the first MOS transistor.

2. The voltage level shifter circuit of claim 1, wherein a signal range of the second voltage level is larger than a signal range of the first voltage level.

3. The voltage level shifter circuit of claim 1, wherein the first and second lower power supplies are at equal voltages and the current-limiting MOS transistors are connected between the second upper power supply and the second CMOS logic circuit.

4. The voltage level shifter circuit of claim 1, wherein the current-limiting MOS transistors are connected as a current mirror with respect to the first MOS transistor and the current through the first MOS transistor is set so that a bias voltage applied on gates of the current-limiting MOS transistors ensures that the current-limiting MOS transistors operate near cut-off or in subsystem-threshold modes.

5. The voltage level shifter circuit of claim 4, wherein the bias voltage is ±100 mV about a threshold voltage $V_T$ of the current-limiting MOS transistors.

6. The voltage level shifter circuit of claim 4, wherein the bias voltage is such that the current-limiting MOS transistors operate in sub-threshold modes.

7. The voltage level shifter circuit of claim 1, wherein the first MOS transistor and the current-limiting MOS transistors are matched and connected so that a voltage on a gate of the first MOS transistor is the same as a voltage on gates of the current-limiting MOS transistors, and the set current through the first MOS transistor matches the currents through the current-limiting MOS transistors.

8. The voltage level shifter circuit of claim 1, wherein the first MOS transistor and the current-limiting MOS transistors are connected to the second upper power supply and gates of the first MOS transistor and the current-limiting MOS transistors are connected together.

9. The voltage level shifter circuit of claim 1, wherein the second CMOS logic circuit comprises a voltage level driver and latch block, and the at least two current-limiting MOS transistors are connected between the voltage level driver and latch block and the second upper power supply.

10. The voltage level shifter circuit of claim 9, wherein a signal range of the second voltage level is larger than a signal range of the first voltage level.

11. The voltage level shifter circuit of claim 1, wherein the first MOS transistor is connected between the second upper power supply and a current source/sink.

12. The voltage level shifter circuit of claim 11, wherein the current source/sink comprises a plurality of series-connected MOS transistors with gates connected to a voltage reference.

13. The voltage level shifter circuit of claim 12, wherein the voltage reference comprises a common power supply.

14. The voltage level shifter circuit of claim 13, wherein the common power supply comprises the first upper power supply.

15. The voltage level shifter circuit of claim 1, wherein the voltage level shifter circuit is part of an integrated circuit having an area equal to or smaller than 2800 μm².

16. A method of operating a voltage level shifter circuit, the voltage level shifter circuit having a first CMOS (complementary metal-oxide-semiconductor) logic circuit receiving input signals within a first voltage level, and a second CMOS logic circuit transmitting shifted output signals within a second voltage level, the method comprising:
    generating a set current;
    passing the set current through a first MOS (metal-oxide-semiconductor) transistor;
    mirroring the set current through the first MOS transistor with currents through at least two current-limiting MOS transistors; and
    driving the second CMOS logic circuit with the currents, the second CMOS logic circuit directly connected between the at least two current-limiting MOS transistors and a first upper power supply or a first lower power supply.

17. The method of claim 16, wherein generating the set current comprises:
    sinking the set current from the first MOS transistor to a second lower power supply by a plurality of series-connected MOS transistors, each having a gate connected to a second upper power supply.

18. The method of claim 17, wherein generating the set current further comprises:
    setting a magnitude of the set current by a number of the series-connected MOS transistors.

19. The method of claim 18, wherein setting the magnitude comprises:
    setting the set current such that a voltage on gates of the current-limiting MOS transistors ensures that the current-limiting MOS transistors operate close to cut-off or in sub-threshold modes.

20. The method of claim 19, wherein setting the magnitude further comprises:
    setting the set current such that the voltage on the gates of the current-limiting MOS transistors is ±100 mV about a threshold voltage $V_T$ of the current-limiting MOS transistors.

21. The method of claim 19, wherein setting the magnitude further comprises:

setting the set current such that the voltage on the gates of the current-limiting MOS transistors ensures that the current-limiting MOS transistors operate in sub-threshold modes.

22. The method of claim 16, wherein the voltage level shifter circuit is part of an integrated circuit having an area equal to or smaller than 2800 µm².

23. The method of claim 16, wherein the second CMOS logic circuit comprises a voltage level driver and latch block.

24. An integrated circuit voltage level shifter circuit comprising:
a first voltage level logic circuit receiving signals within a first voltage level, the first voltage level logic circuit operating within the first voltage level and connected to a first voltage power supply;
a shifting logic circuit receiving signals from the first voltage level logic circuit and shifting first logic level signals to second logic level signals;
a second voltage level logic circuit receiving shifted signals from the shifting logic circuit, the second voltage level logic circuit operating within a second voltage level and connected to a second voltage power supply;
a bias voltage generator circuit; and
two current-limiting MOS (metal-oxide-semiconductor) transistors connected between the second voltage level logic circuit and the second voltage power supply, the current-limiting MOS transistors responsive to a bias voltage from the bias voltage generator circuit to provide limited currents through the second voltage level logic circuit to limit an amount of power consumed by the second voltage level logic circuit during switching.

25. The voltage level shifter circuit of claim 24, wherein the bias voltage generator circuit comprises a first MOS transistor and a current source/sink, an amount of current generated by the current source/sink through the first MOS transistor setting the bias voltage.

26. The voltage level shifter circuit of claim 25, wherein a range of the second voltage level signals is larger than a range of the first voltage level signals.

27. The voltage level shifter circuit of claim 25, wherein the current source/sink comprises a plurality of MOS transistors connected in series.

28. The voltage level shifter circuit of claim 24, wherein each of the two current-limiting MOS transistors is arranged as a current mirror of a first MOS transistor.

29. The voltage level shifter circuit of claim 28, wherein a current through the first MOS transistor is set so that the bias voltage is applied on a gate of each of the two current-limiting MOS transistors so that each of the two current-limiting MOS transistors operates close to its cut-off or in sub-threshold modes.

30. The voltage level shifter circuit of claim 29, wherein the bias voltage is ±100 mV about a threshold voltage $V_T$ of each of the two current-limiting MOS transistors.

31. The voltage level shifter circuit of claim 29, wherein the bias voltage is such that each of the two current-limiting MOS transistors operates in its sub-threshold mode.

32. The voltage level shifter circuit of claim 24, wherein the voltage level shifter circuit is part of an integrated circuit having an area equal to or smaller than 2800 µm².

* * * * *